(12) United States Patent
Hu

(10) Patent No.: US 9,837,347 B2
(45) Date of Patent: Dec. 5, 2017

(54) COAXIAL COPPER PILLAR

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 38 days.

(21) Appl. No.: 15/074,757

(22) Filed: Mar. 18, 2016

(65) Prior Publication Data

US 2017/0047281 A1 Feb. 16, 2017

Related U.S. Application Data

(60) Provisional application No. 62/205,021, filed on Aug. 14, 2015.

(51) Int. Cl.
| | |
|---|---|
| *H01L 23/498* | (2006.01) |
| *H01L 21/78* | (2006.01) |
| *H01L 23/00* | (2006.01) |
| *H01L 21/48* | (2006.01) |
| *H01L 21/027* | (2006.01) |
| *H01L 21/56* | (2006.01) |
| *H05K 3/40* | (2006.01) |

(52) U.S. Cl.
CPC .... *H01L 23/49866* (2013.01); *H01L 21/0273* (2013.01); *H01L 21/4853* (2013.01); *H01L 21/78* (2013.01); *H01L 23/49811* (2013.01); *H01L 24/97* (2013.01); *H01L 21/561* (2013.01); *H01L 24/16* (2013.01); *H01L 24/32* (2013.01); *H01L 24/73* (2013.01); *H01L 24/92* (2013.01); *H01L 2224/16227* (2013.01); *H01L 2224/32225* (2013.01); *H01L 2224/73204* (2013.01); *H01L 2224/92125* (2013.01); *H01L 2224/97* (2013.01); *H01L 2924/01029* (2013.01); *H01L 2924/15311* (2013.01); *H01L 2924/18161* (2013.01); *H05K 3/4007* (2013.01); *H05K 2201/09809* (2013.01)

(58) Field of Classification Search
CPC .... H05K 1/0219; H05K 3/3436; H05K 3/101; H01L 23/12
See application file for complete search history.

(56) References Cited

U.S. PATENT DOCUMENTS

2002/0027022 A1* 3/2002 Moriizumi ............ H01L 21/486
174/267

* cited by examiner

*Primary Examiner* — Matthew Landau
*Assistant Examiner* — Krista Soderholm
(74) *Attorney, Agent, or Firm* — JCIPRNET

(57) ABSTRACT

A coaxial copper pillar for signal transmission with signal shield is disclosed so that signal integrity for the signal passes transmission is maintained. One embodiment shows at least one coaxial copper pillar is made as a terminal connector for a chip package, the coaxial copper pillars are made adaptive for electrically coupling the chip package to a mother board.

16 Claims, 21 Drawing Sheets

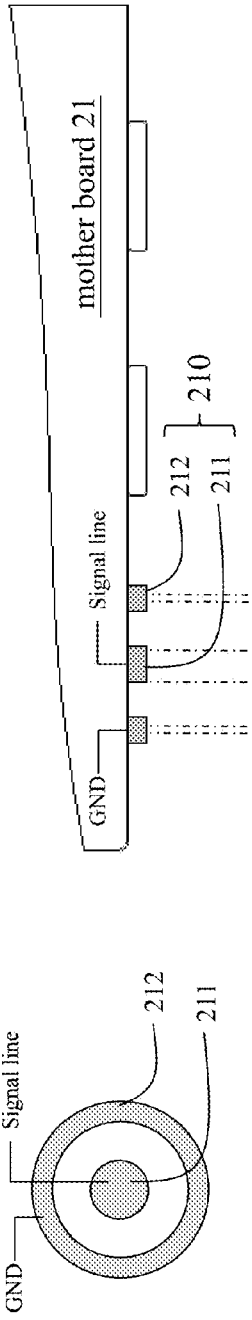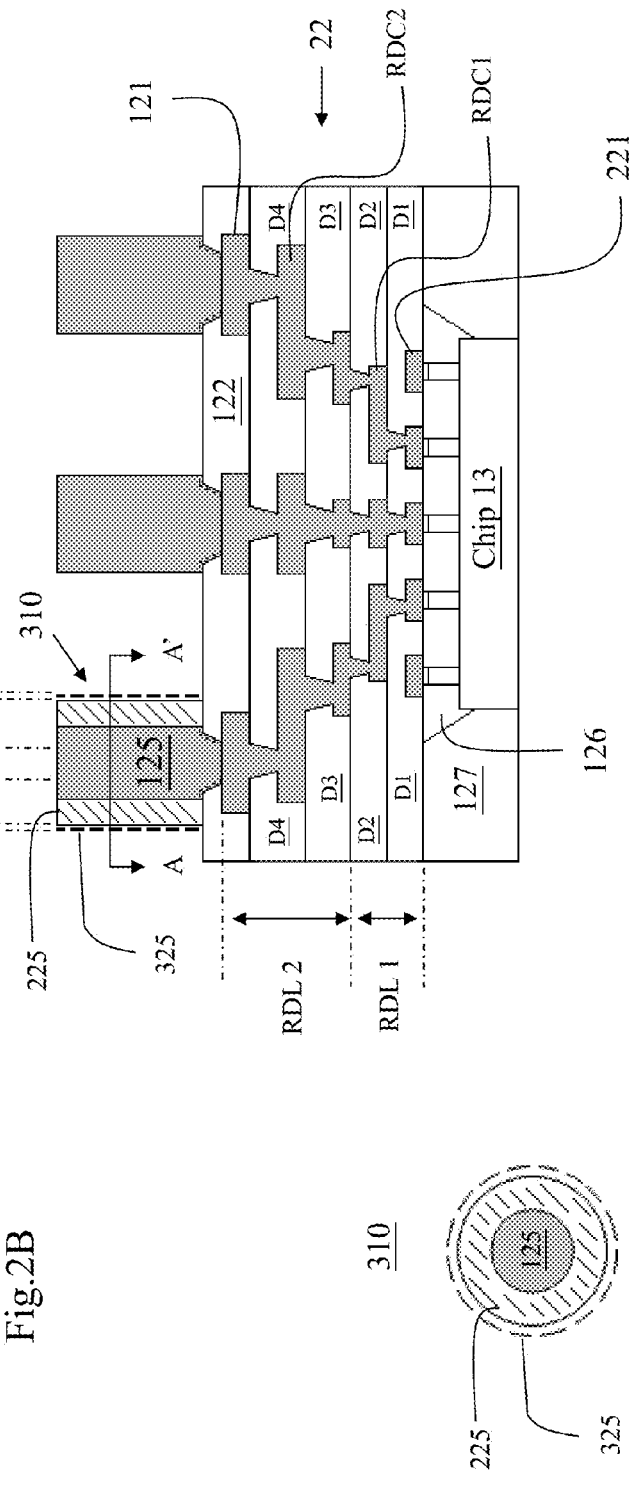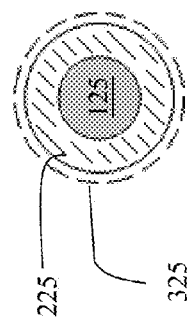

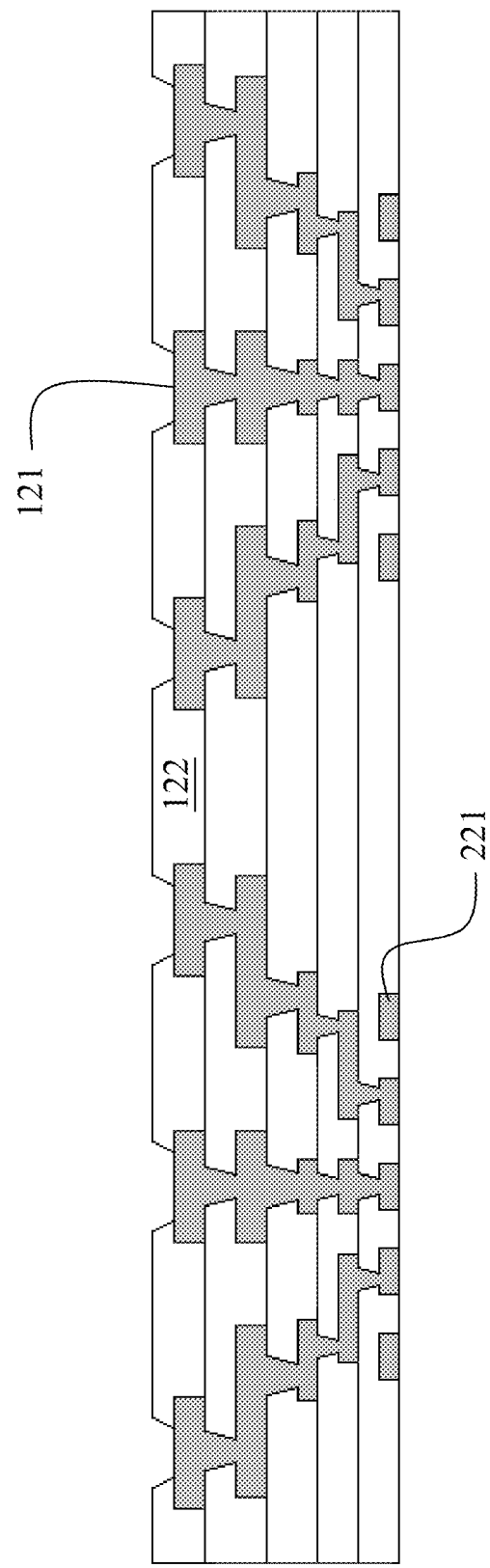

US 9,837,347 B2

COAXIAL COPPER PILLAR

RELATED APPLICATIONS

The present application claims the benefit of U.S. Provisional Application No. 62/205,021, filed Aug. 14, 2015, the disclosure of which is hereby incorporated by reference herein in its entirety.

BACKGROUND

Technical Field

The present invention relates to a coaxial copper pillar, especially relates to a coaxial copper pillar designed for signal transmission in an electronic system.

Description of Related Art

FIG. 1 show a prior art

FIG. 1 shows a prior art

FIG. 1 shows a chip package and a mother board 11. The chip package is ready to be mounted onto the mother board 11. The mother board 11 has a plurality of metal pads 113 on a bottom surface. The chip package has a plurality of solder balls 123 adaptive for electrically coupled to the metal pads 113 of the mother board 11. The chip package comprises a package substrate 12. The package substrate 12 has a plurality of top metal pads 121. A passivation layer 122 is configured on a top surface of the package substrate 12. A chip 13 is configured on a bottom of the package substrate 12. A finer metal connector to replace the solder ball connector is needed to develop for a compact chip package.

BRIEF DESCRIPTION OF THE DRAWINGS

FIGS. 2A~2C show an embodiment according to the present invention.

FIGS. 3~2C show a fabricating process for the embodiment according to the present invention.

DETAILED DESCRIPTION OF THE INVENTION

Figure 1:
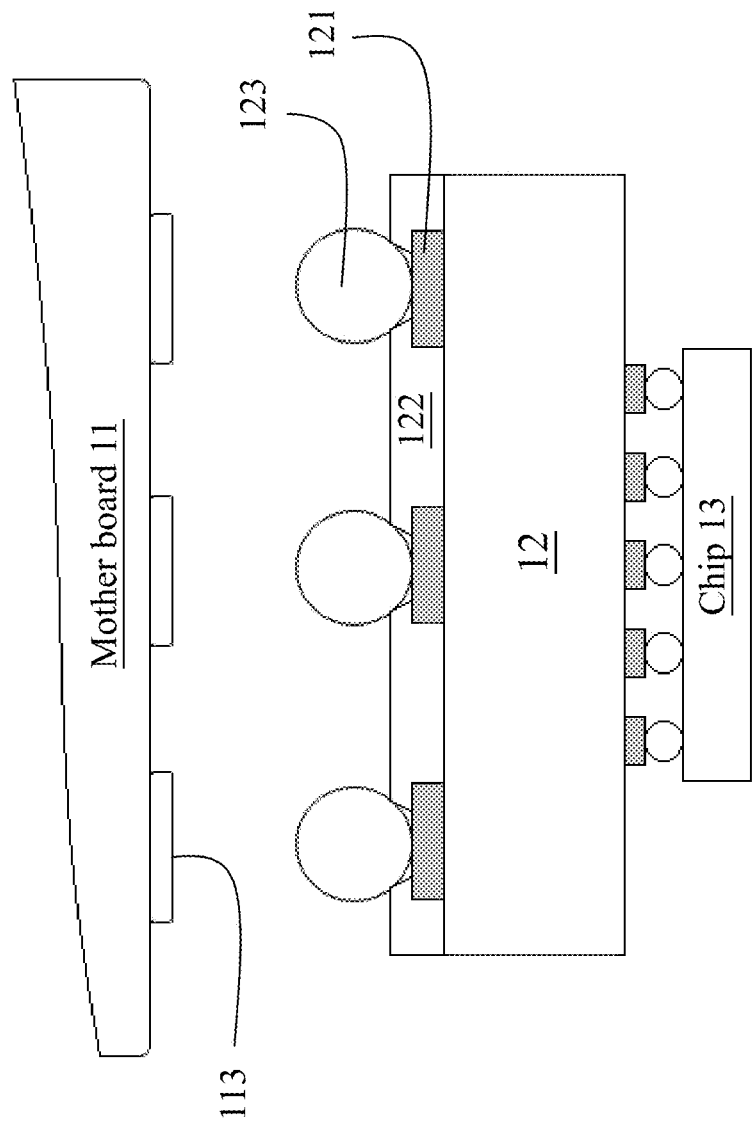
FIG. 1 show a prior art.

A coaxial copper pillar is fabricated for maintaining a signal integrity during signal transmission. The coaxial copper pillar has a core copper pillar made for signal transmission and a dielectric layer wraps around the core copper pillar. A copper layer wraps around the dielectric layer as a signal shield.

FIGS. 2A~2C show an embodiment system according to the present invention.

FIG. 2A shows a mother board 21 having a coaxial metal pad 210 formed on a bottom surface of the mother board 121. The coaxial metal pad 210 comprises a core metal pad 211 and a circular metal pad 212. The circular metal pad 212 encircles the core metal pad 211. The core metal pad 211 is made electrically coupled to a signal line of an electronic system (not shown). The circular metal pad 212 is made electrically coupled to a ground line of the electronic system.

FIG. 2B shows a bottom view of the coaxial metal pad of FIG. 2A. FIG. 2B shows the circular metal pad 212 encircles the core metal pad 211. The circular metal pad 212 functions as a signal shield for the core metal pad 211.

FIG. 2C shows a chip package having a coaxial copper pillar according to the present invention.

FIG. 2C shows a package substrate 22. The package substrate 22 has a plurality of top metal pads 121. A coaxial copper pillar 310 is formed on a top surface of a selected top copper pillar 121.

The coaxial copper pillar 310 comprises a core copper pillar 125. The core copper pillar 125 has a bottom end electrically coupled to the selected top metal pad 121. The coaxial copper pillar 310 comprises a dielectric layer 225 wraps around an outer surface of the core copper pillar 125. Further, a copper layer 325 wraps around an outer surface of the dielectric layer 225.

The package substrate 22 comprises a first redistribution layer RDL1 and a second redistribution layer RDL2. The first redistribution layer RDL1 has a first redistribution circuitry RDC1 embedded in a first dielectric layer(s) D1, D2. The second redistribution layer RDL2 configured on a top surface of the first redistribution layer RDL1. The second redistribution layer RDL2 comprises a second redistribution circuitry RDC2 embedded in a second dielectric layer(s) D3, D4. The top metal pad 121 is configured on a top surface of the package substrate 22 and is a portion of the second redistribution circuit RDC2.

At lease one chip 13 is configured on a bottom surface of the package substrate 22. The chip 13 is electrically coupled to a bottom metal pad of the package substrate 22. An underfill material 126 is filled into a gap between the chip 13 and a bottom surface of the package substrate 22. A molding compound 127 encapsulates the chip 13.

A passivation layer 122 is configured on a top surface of the package substrate 22 and exposes a central area of the top metal pad 121 for further electrical connection.

FIGS. 3~21 show a fabricating process for a coaxial copper pillar according to the present invention.

Figure 4:
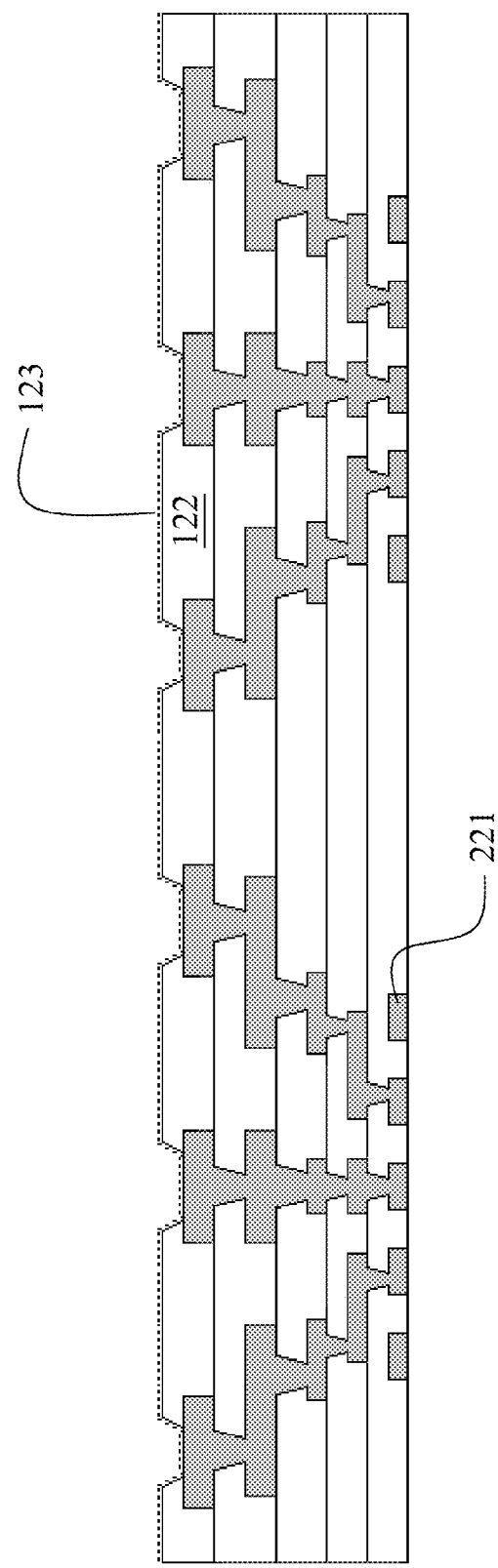
Figure 5:
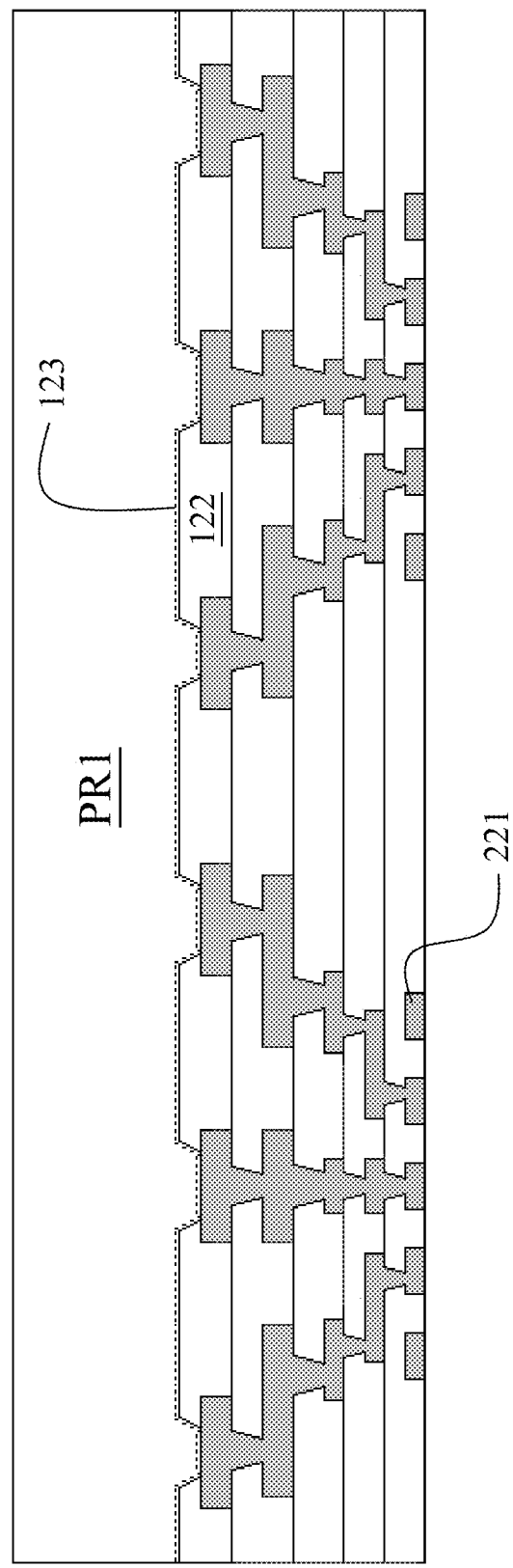
Figure 6:
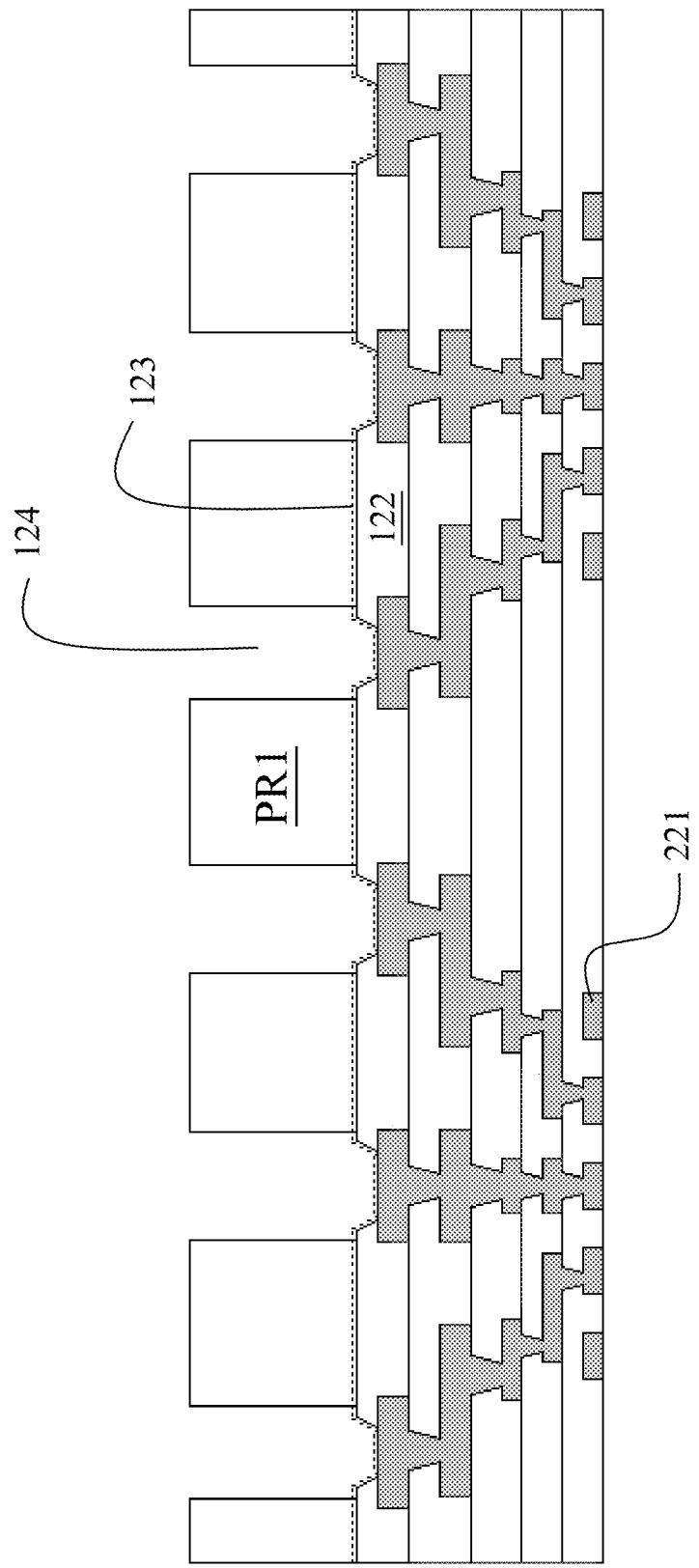
Figure 7:
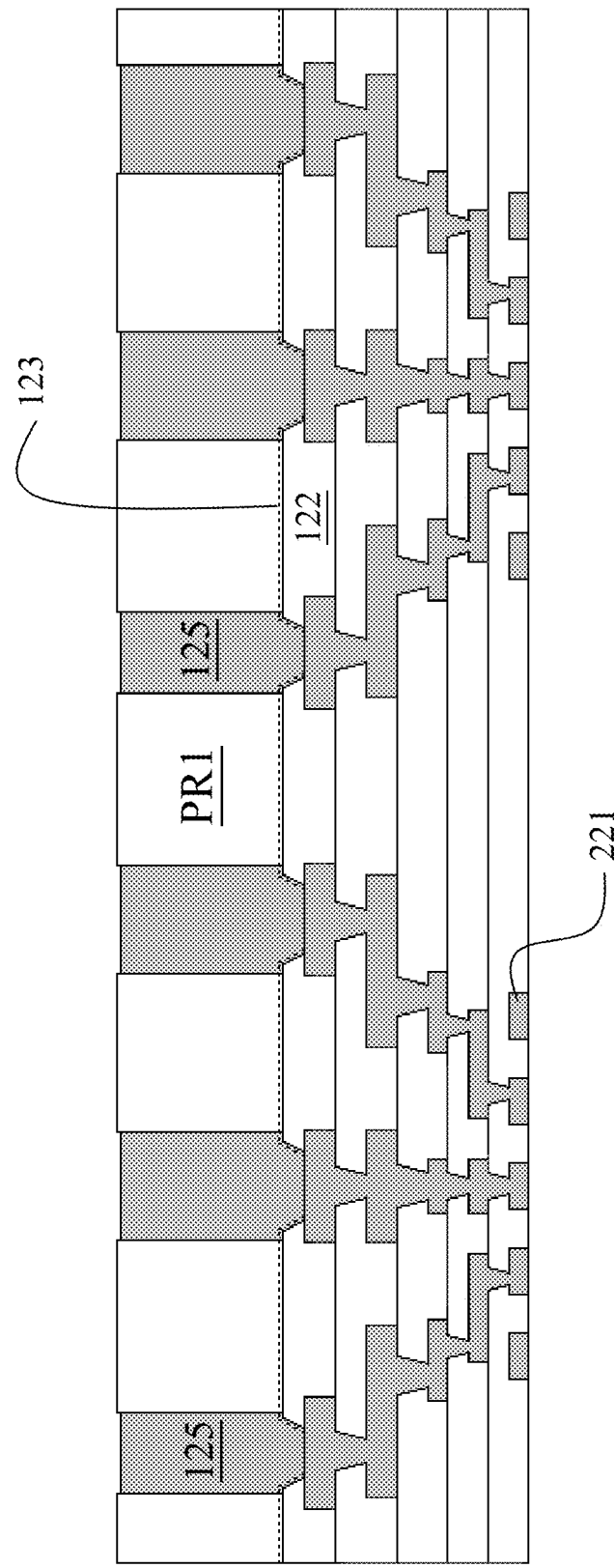
Figure 8:
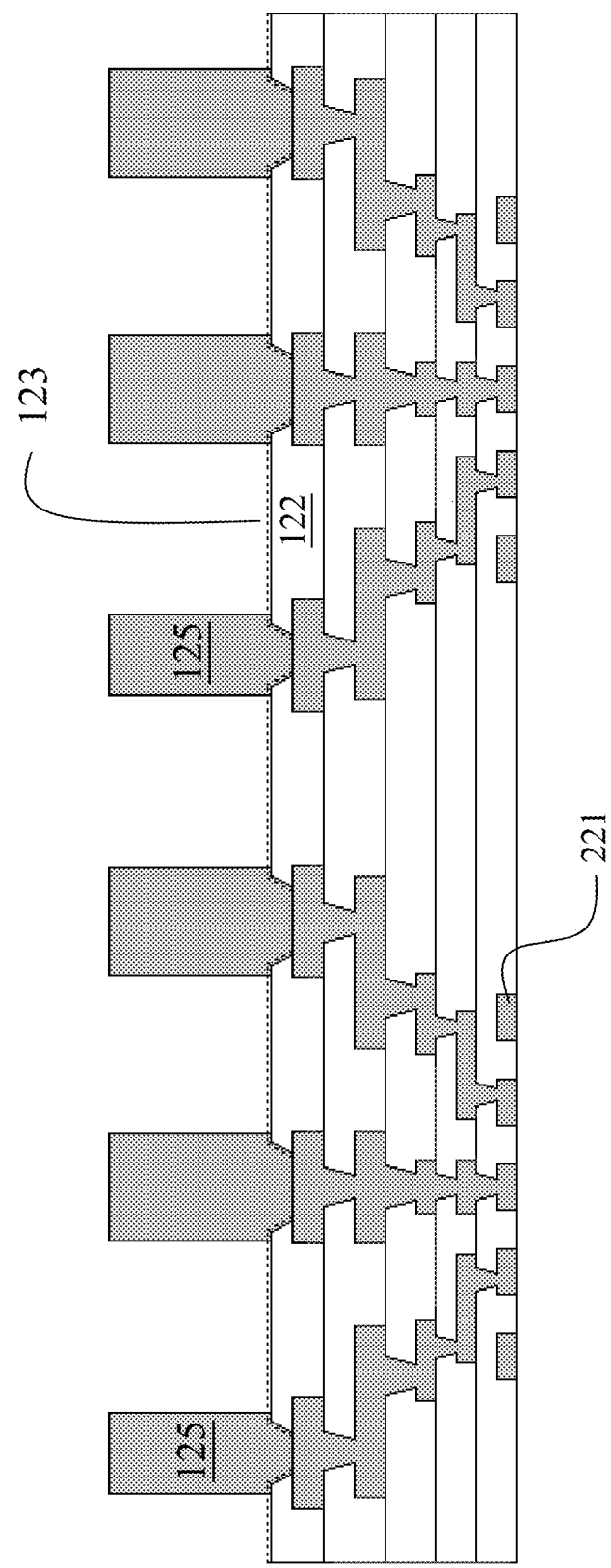
Figure 9:
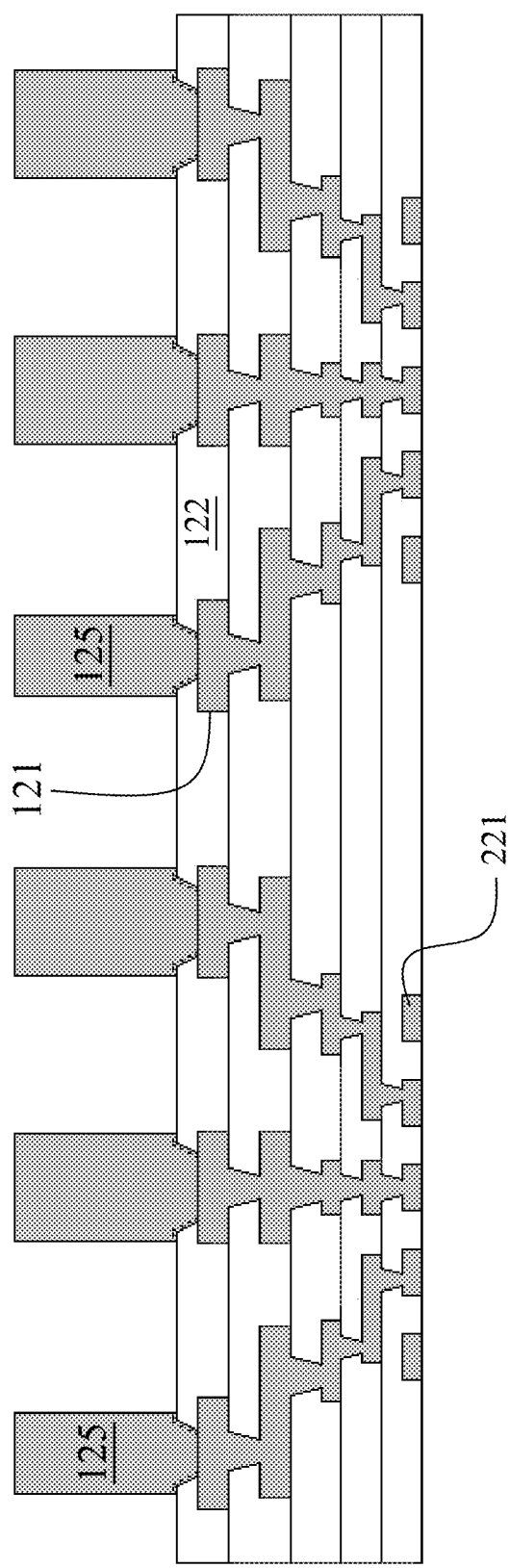
Figure 10:
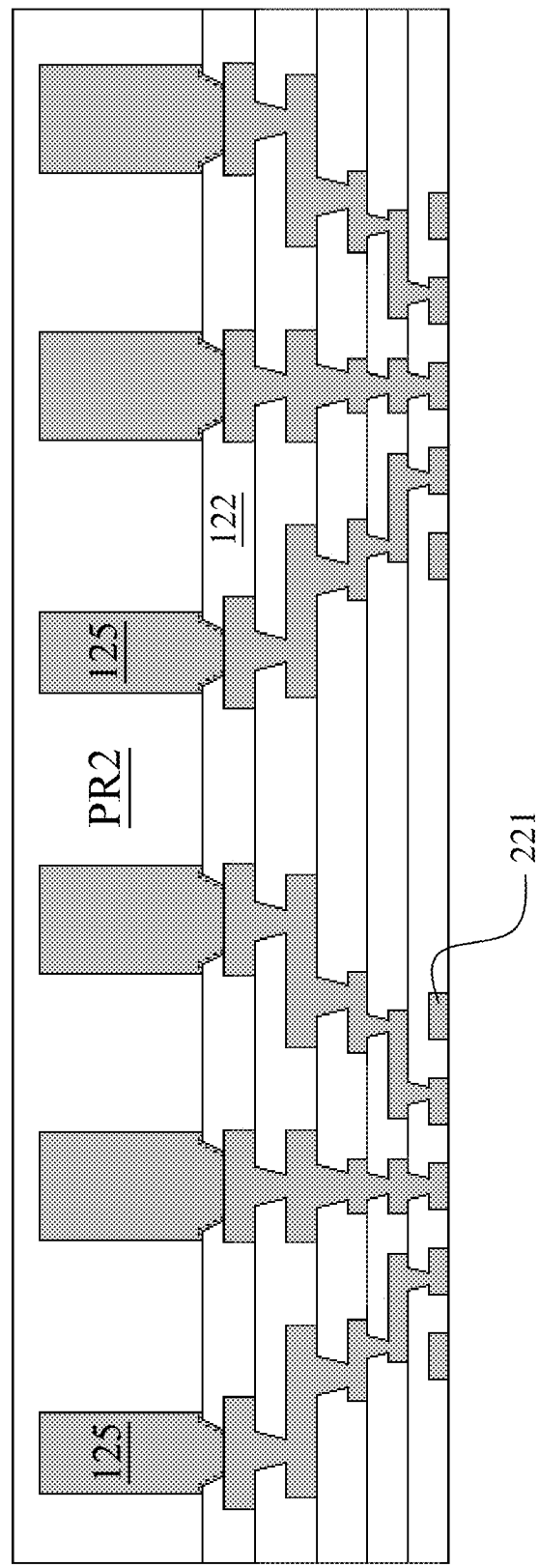
Figure 11:
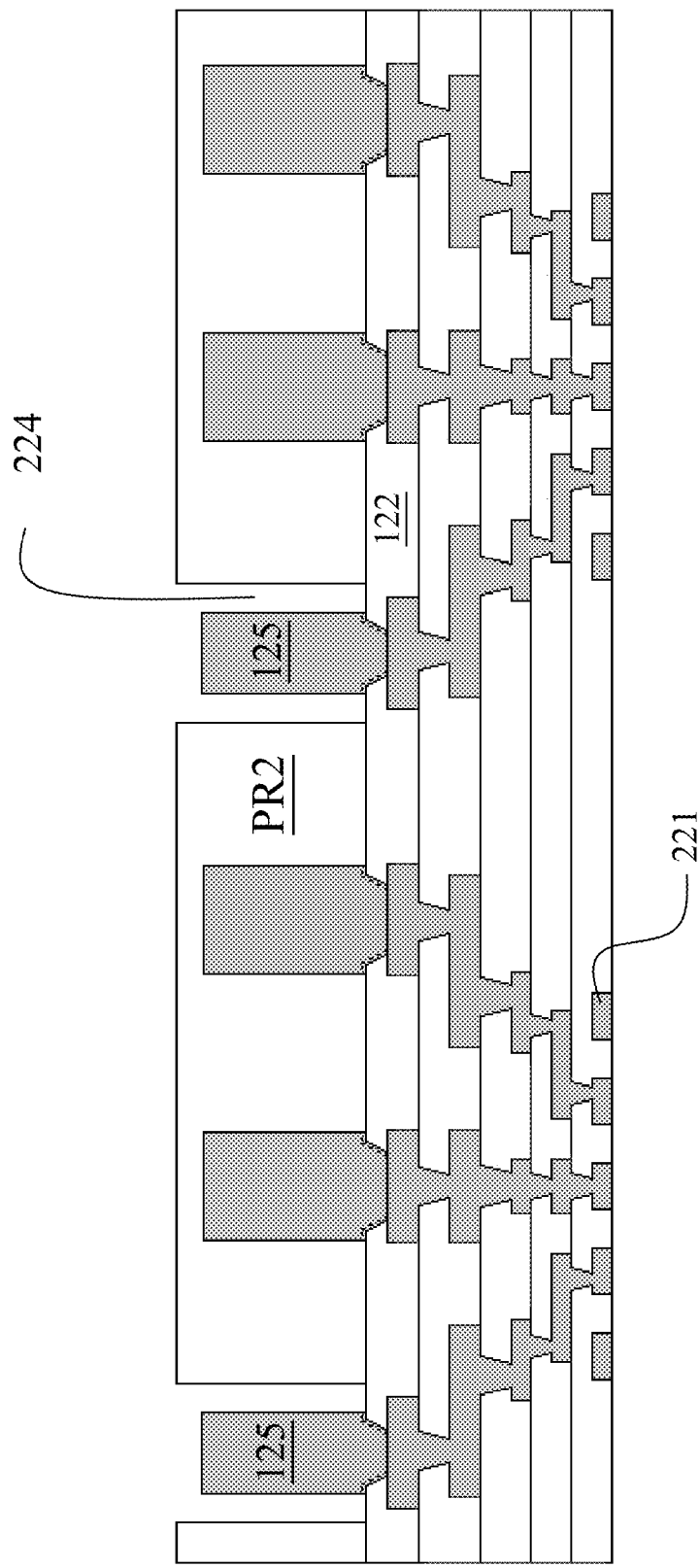
Figure 12:
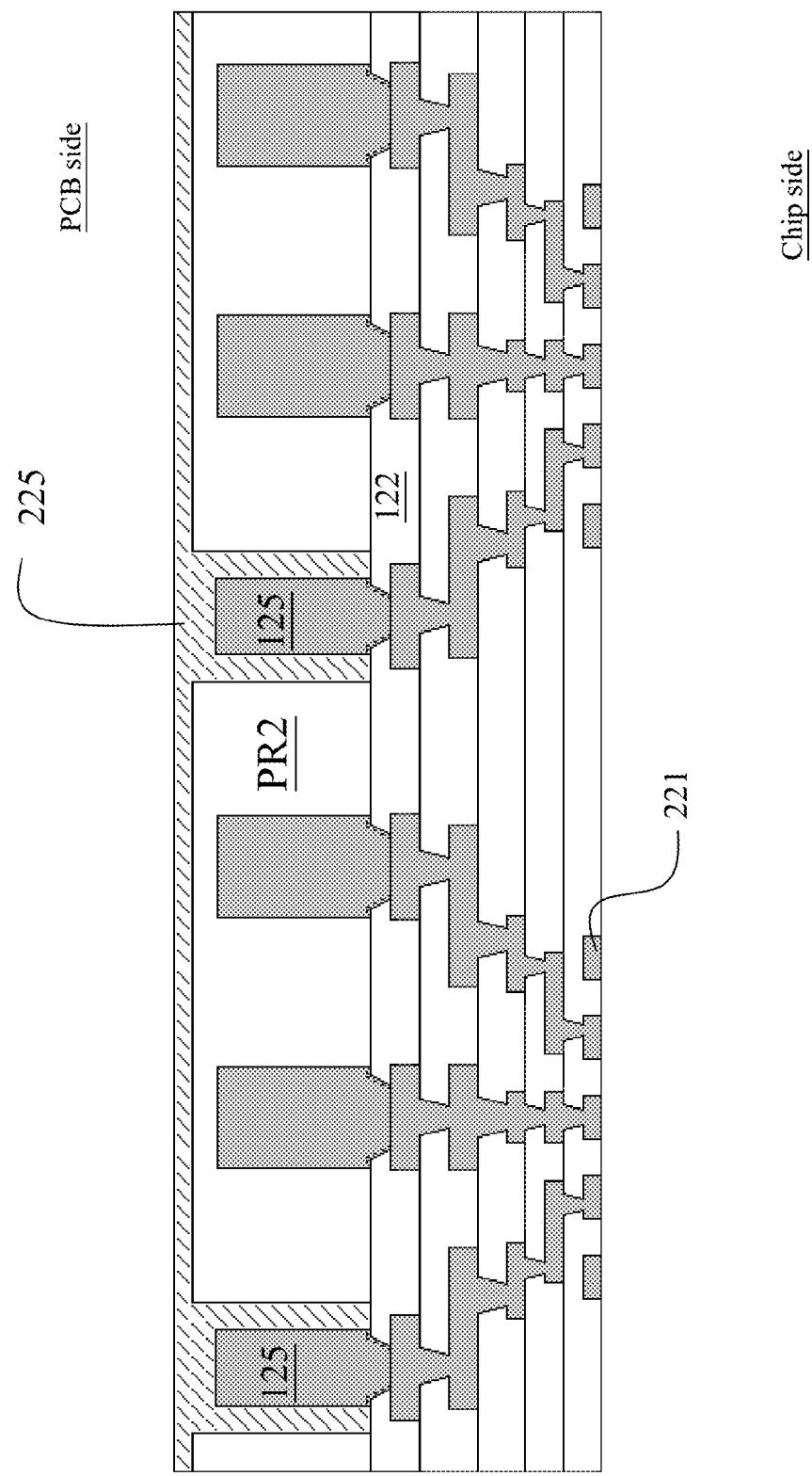
Figure 13:
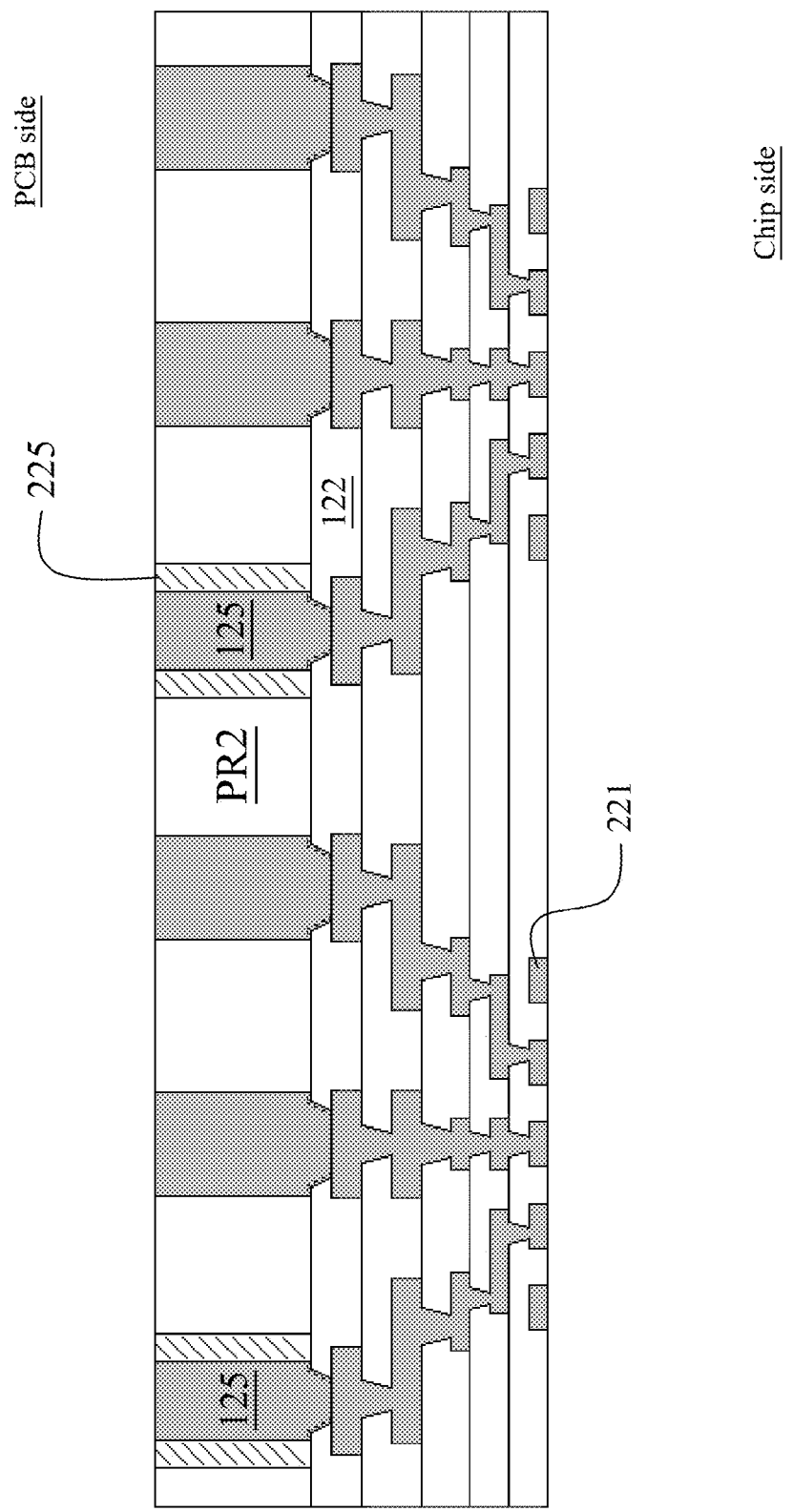
Figure 14:
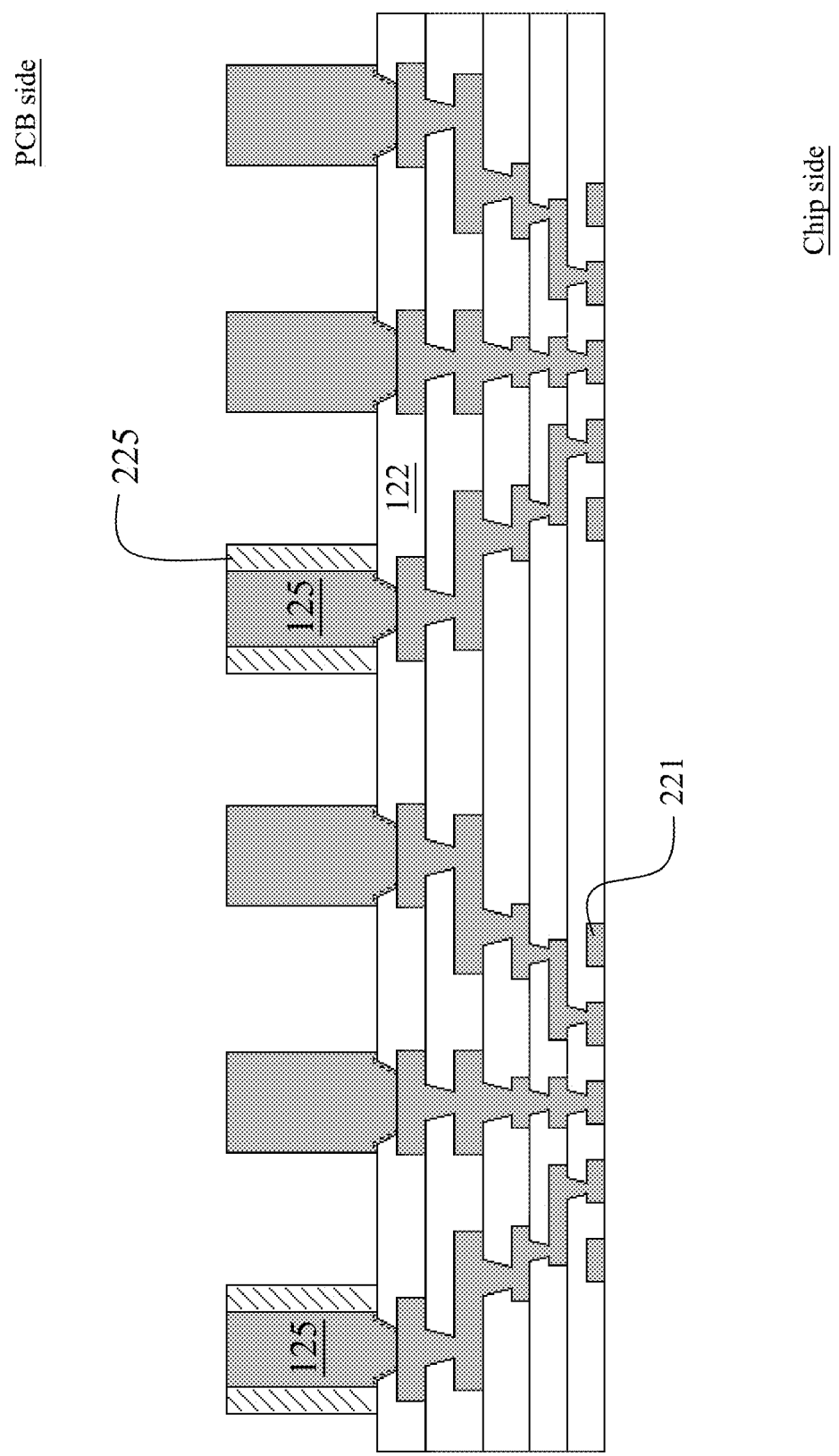
Figure 15:
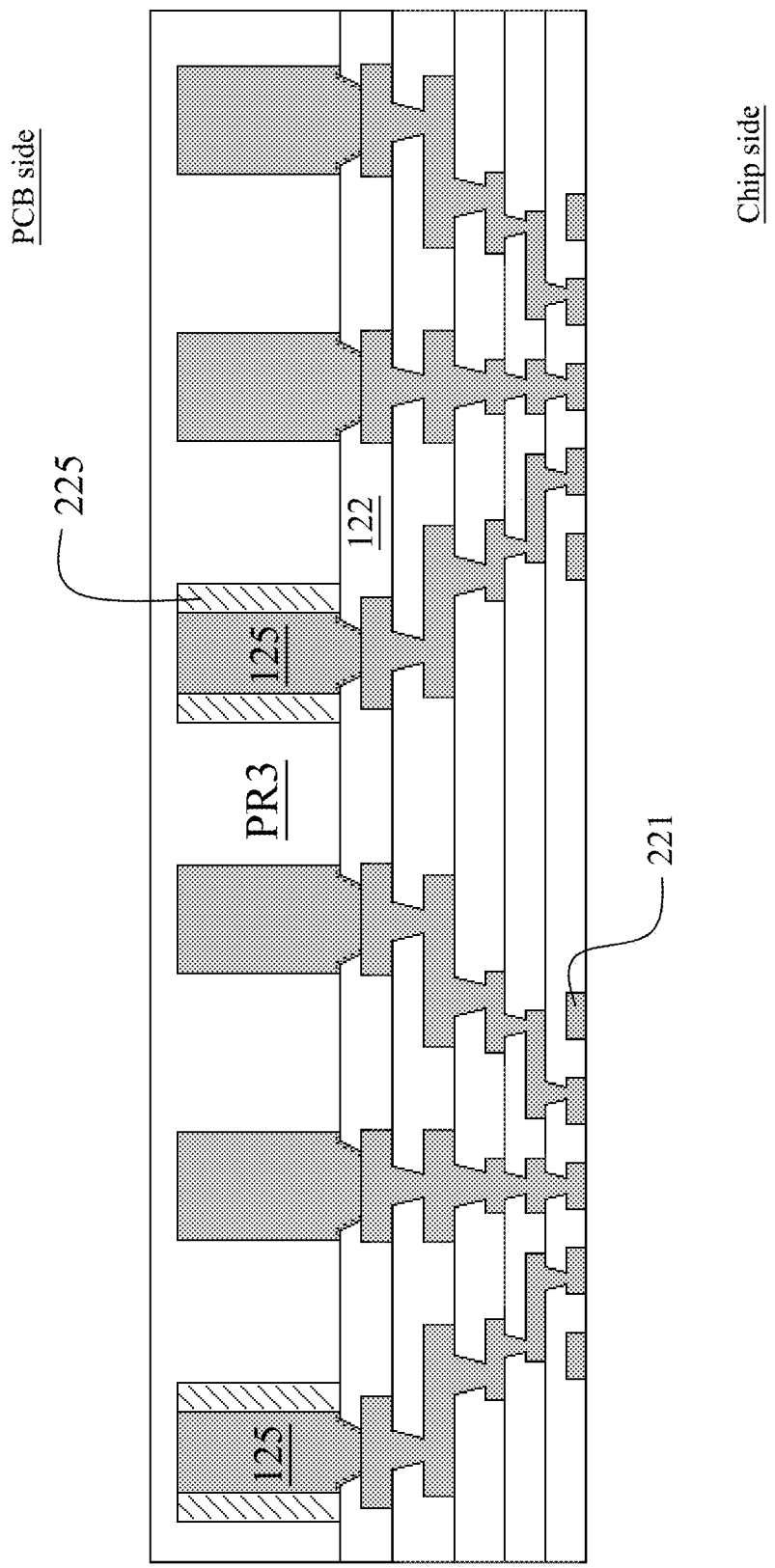
Figure 16:
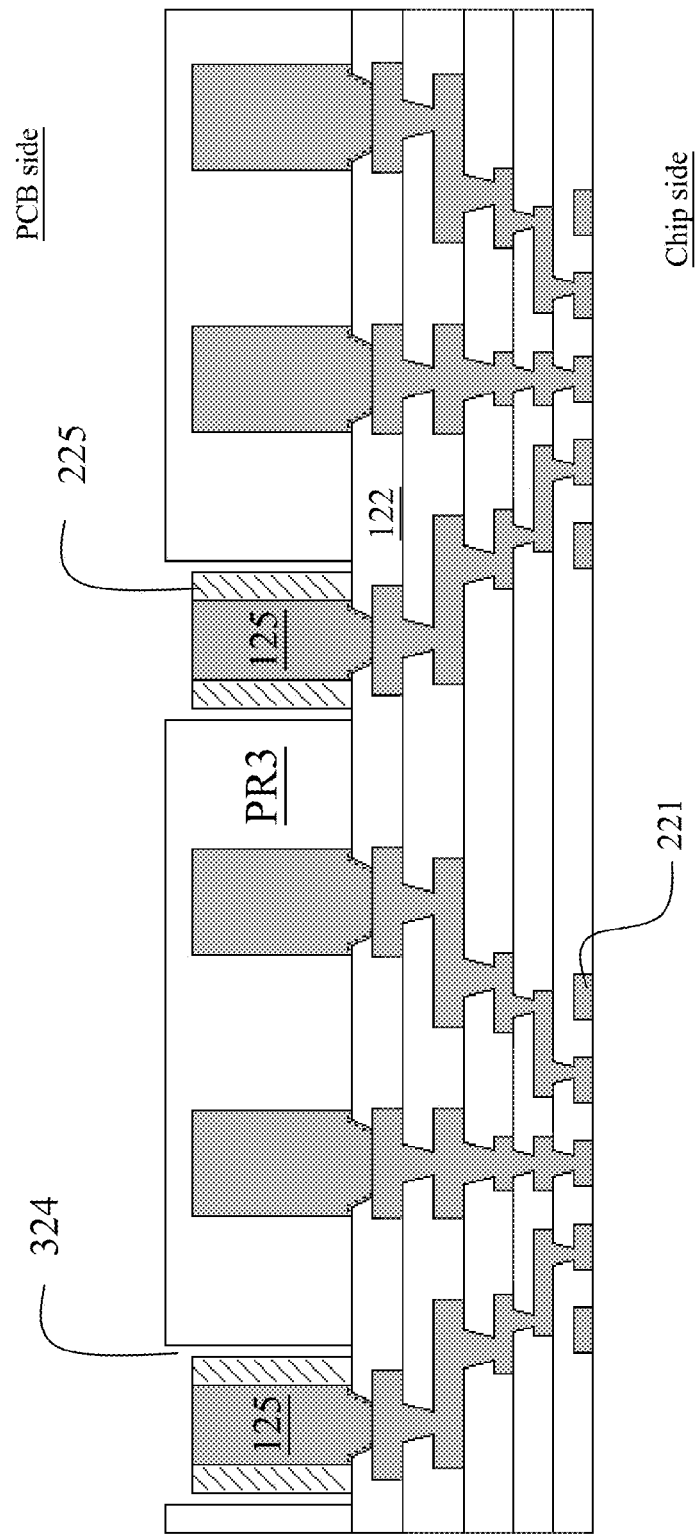
Figure 17:
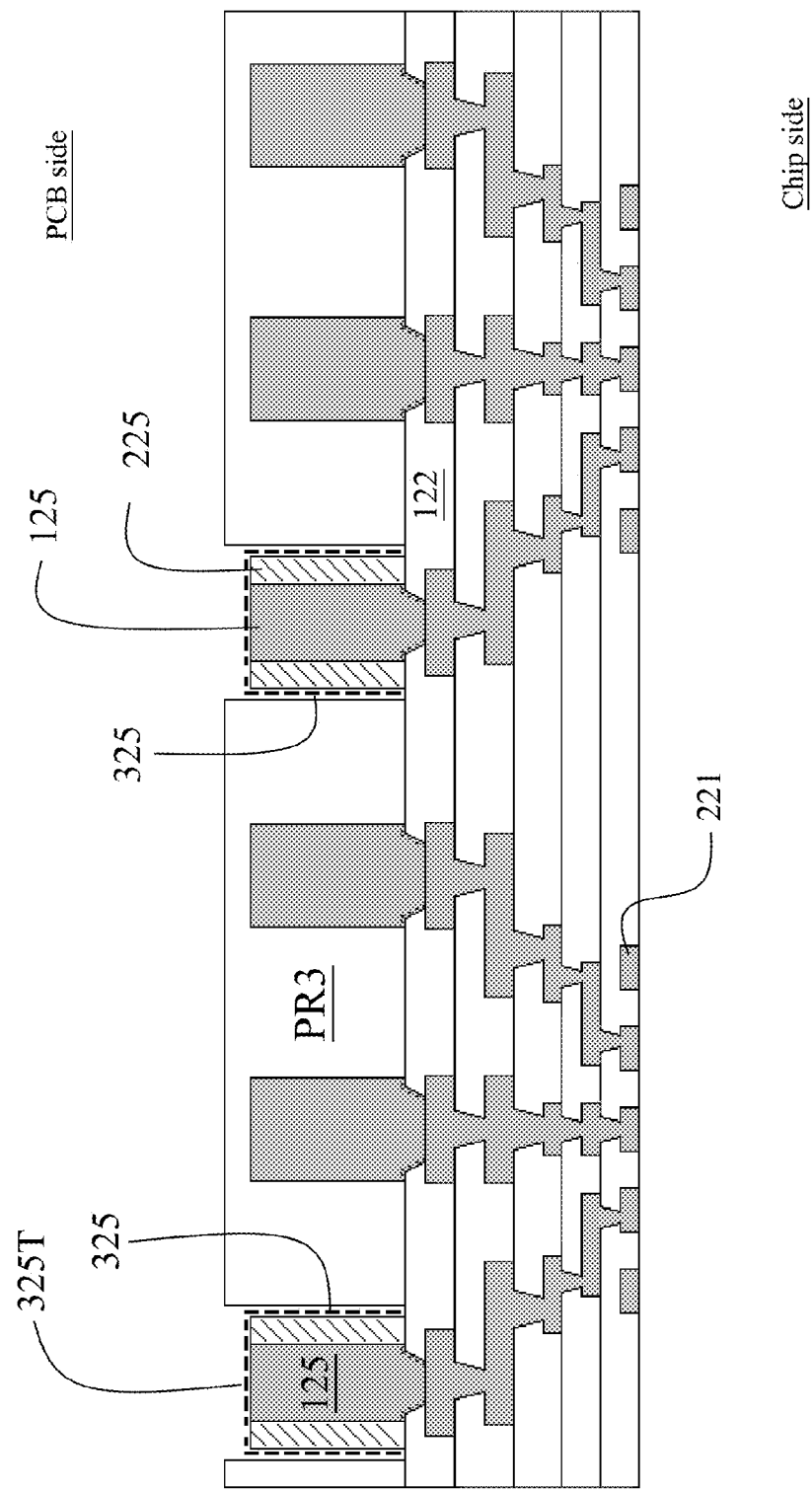
Figure 18:
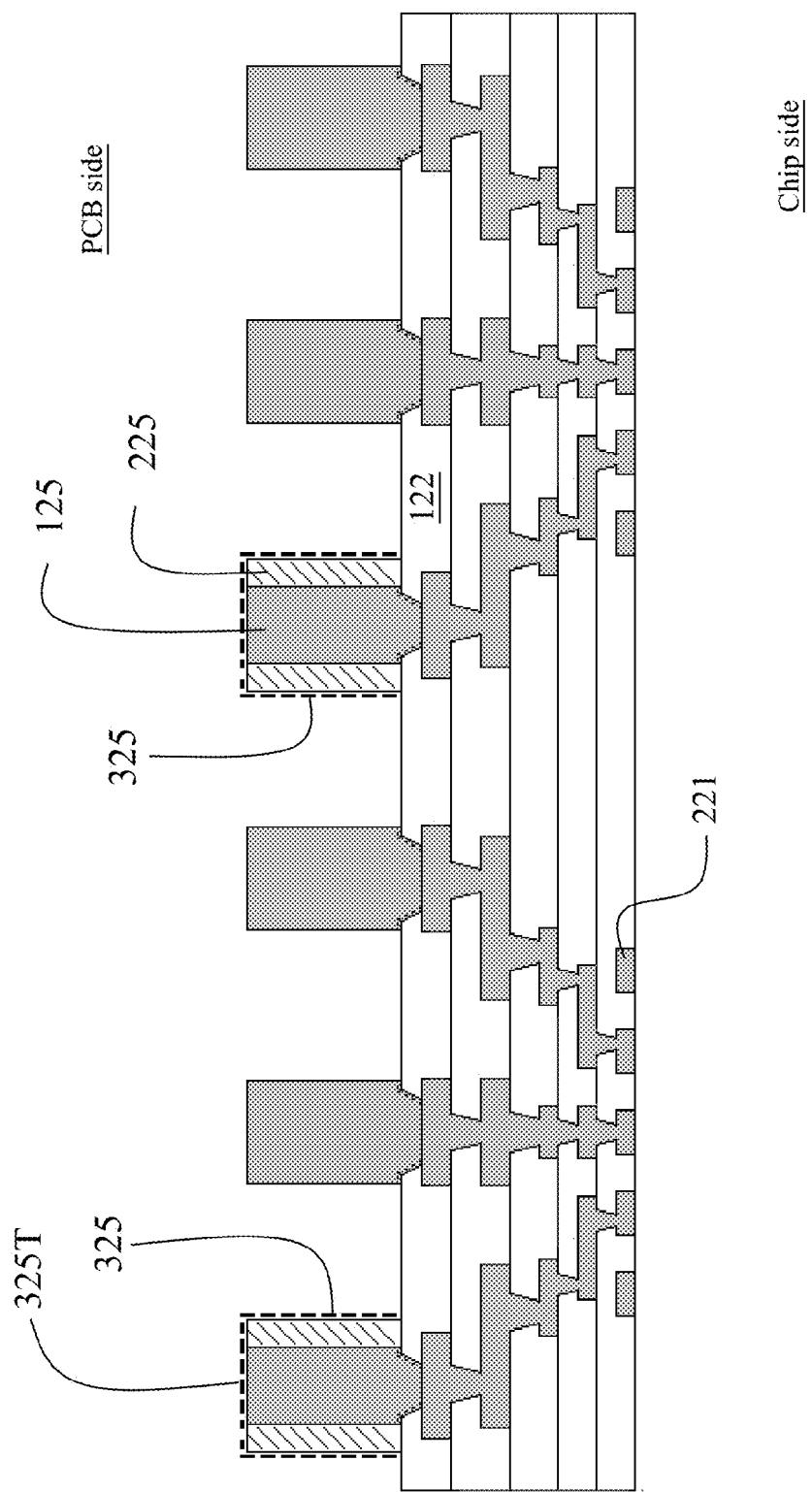
Figure 19:
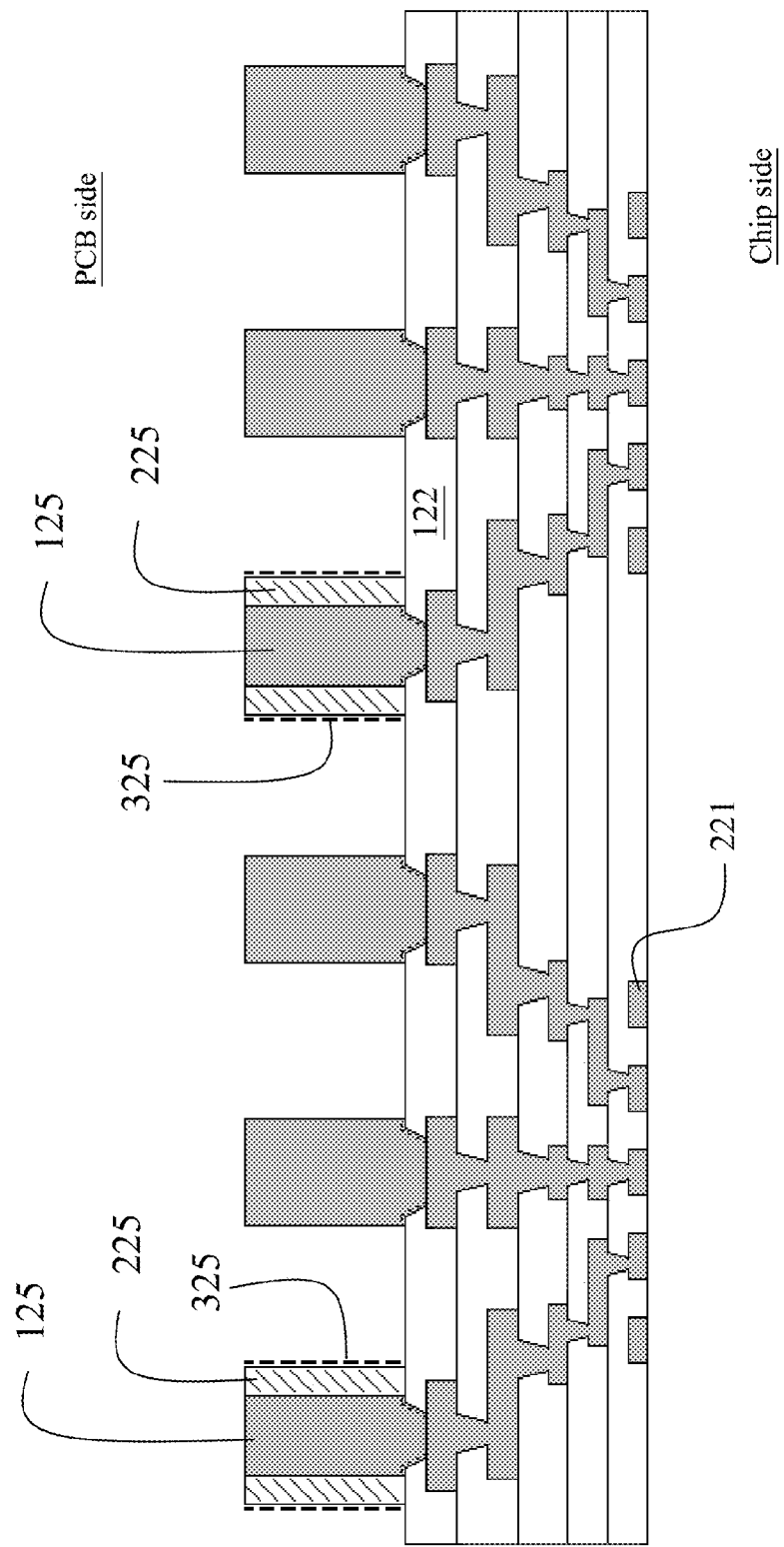
Figure 20:
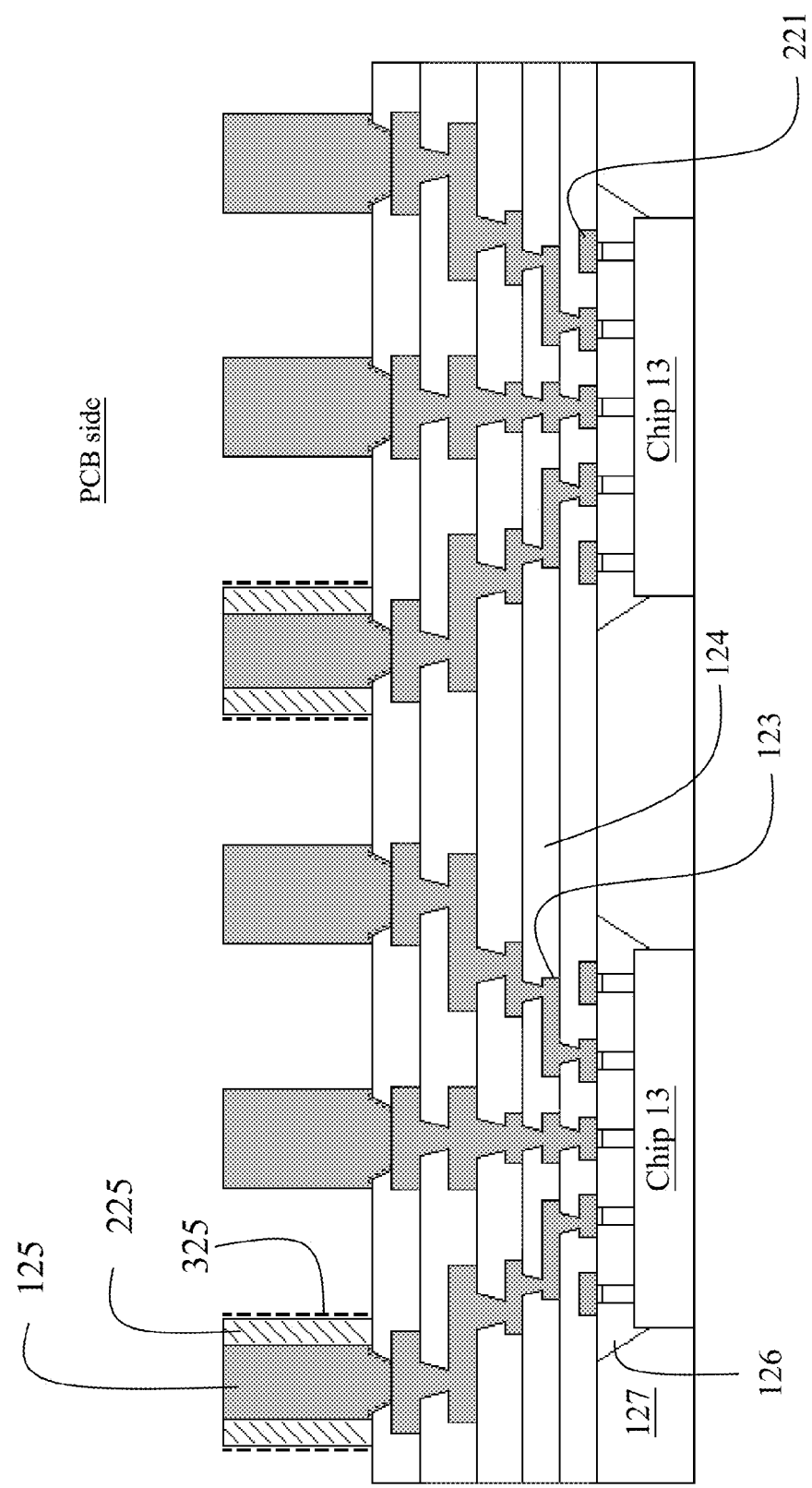
Figure 21:
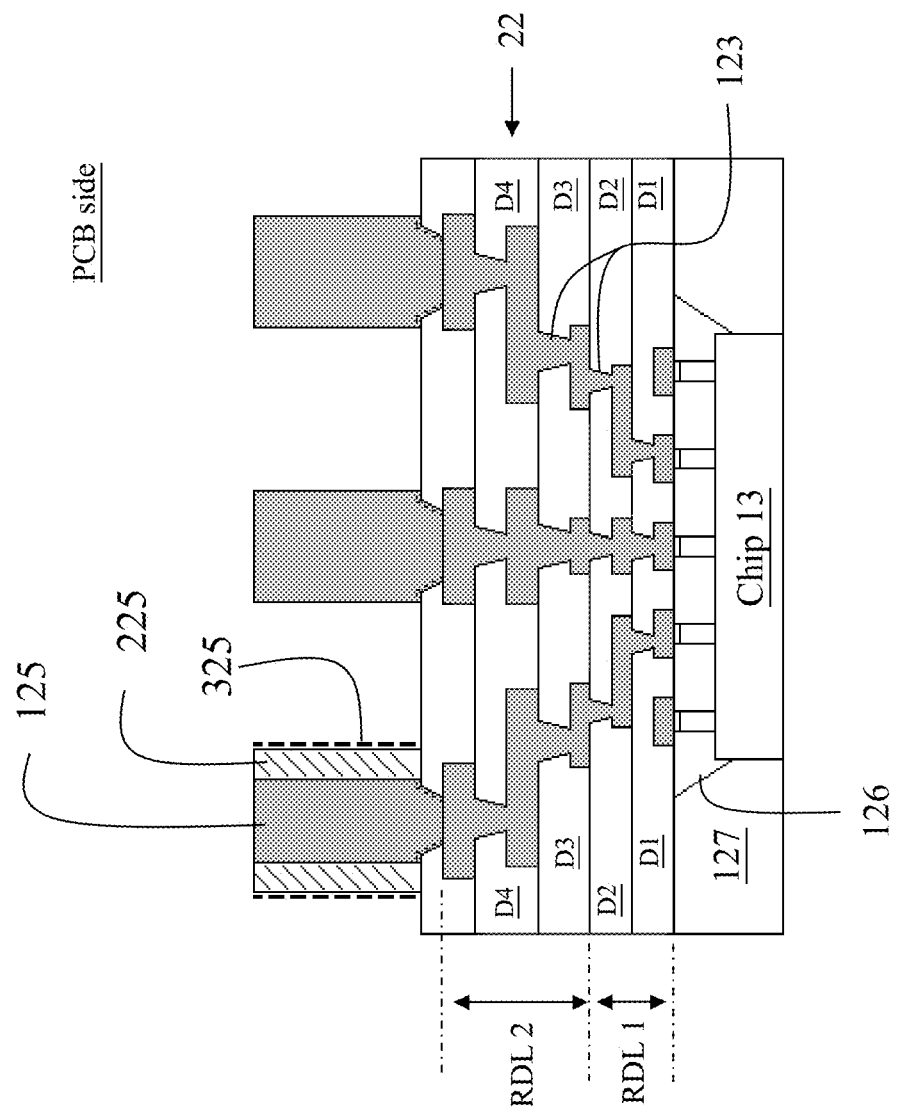

A fabricating process for a coaxial copper pillar, comprises:

FIG. 3 shows: preparing a substrate 22; wherein at least one metal pad 121 is configured on a top surface of the substrate 22; a passivation 122 is configured on a top surface of the substrate 22; and a central area of the metal pad 121 is exposed;

FIG. 4 shows: forming a seed layer 123 on a top surface of each metal pad 121 and the passivation layer 122;

FIG. 5 shows: forming a first photoresist layer (PR1) on a top surface of the seed layer 123;

FIG. 6 shows: patterning the first photoresist layer (PR1) to form a plurality of first grooves 124;

FIG. 7 shows: plating to fill metal, e.g. copper, in each first groove 124 to form a plurality of copper pillars 125;

FIG. 8 shows: stripping the first photoresist layer (PR1);

FIG. 9 shows: stripping the seed layer 123 between the copper pillars 125;

FIG. 10 shows: forming a second photoresist layer (PR2) on a top surface of the passivation layer 122 and the copper pillars 125;

FIG. 11 shows: patterning the second photoresist layer (PR2) to form a plurality of second grooves 224 to expose selected copper pillars 125;

FIG. 12 shows: filling dielectric material 225 into the second grooves 224;

FIG. 13 shows: removing excessive materials on a top surface of the copper pillars 125;

FIG. 14 shows: stripping the second photoresist layer (PR2);

FIG. 15 shows: forming a third photoresist layer (PR3);

FIG. 16 shows: patterning the third photoresist layer (PR3) to form a plurality of third grooves 324 to expose the selected copper pillar 125 wrapped by the dielectric layer 225;

FIG. 17 shows: electroless plating to form copper layer 325, 325T wrapping an exposed surface of the dielectric layer; wherein the copper layer 325 wraps a side wall surface, and the copper layer 325T is configured on a top surface of the selected copper pillar 125 wrapped by the dielectric layer 225;

FIG. 18 shows: stripping the third photoresist layer (PR3);

FIG. 19 shows: removing the top copper layer 325T on a top surface of the copper pillar 125 wrapped by the dielectric layer 225;

FIG. 20 shows: mounting at least a chip 13 on a bottom surface of the bottom pads 221; and underfilling a space between the chip 13 and the substrate 22; and FIG. 21 shows: singulating to form a plurality of chip package units.

While several embodiments have been described by way of example, it will be apparent to those skilled in the art that various modifications may be configured without departs from the spirit of the present invention. Such modifications are all within the scope of the present invention, as defined by the appended claims.

What is claimed is:

1. A package substrate, comprising:
    a metal pad; and
    a coaxial copper pillar which comprises:
        a core copper pillar on a top surface of the metal pad;
        a dielectric layer wrapping around an outer surface of the core copper pillar;
        a metal layer wrapping around an outer surface of the dielectric layer;
        first and second dielectric layers;
        a bottom first redistribution circuitry on a bottom end of the core copper pillar, wherein the bottom first redistribution circuit is embedded in the first dielectric layer, and the bottom first redistribution circuitry comprises:
            a plurality of first conductive layers; and
            a plurality of first conductive vias electrically connecting the plurality of first conductive layers to each other, wherein a topmost conductive layer among the plurality of first conductive layers comprises a plurality of top terminal pads one of which is the metal pad corresponding to the coaxial copper pillar; and
        a bottom second redistribution circuitry on a bottom surface of the bottom first redistribution circuitry, wherein the bottom second redistribution circuitry is embedded in the second dielectric layer, and the bottom second redistribution circuitry comprises:
            a plurality of second conductive layers; and
            a plurality of second conductive vias electrically connecting the plurality of second conductive layers to each other, wherein a bottommost conductive layer among the plurality of second conductive layers comprises a plurality of bottom terminal pads, wherein
        a thickness of each first conductive layer among the plurality of first conductive layers is greater than a thickness of each second conductive layer among the plurality of second conductive layers, and
        a thickness of the first dielectric layer is greater than a thickness of the second dielectric layer.

2. The package substrate as claimed in claim 1, further comprising:
    a passivation layer on a top surface of the metal pad and exposing a central area of the metal pad,
    wherein the exposed central area of the metal pad is connected to a bottom end of the core copper pillar.

3. A package substrate, comprising:
    a metal pad; and
    a coaxial copper pillar which comprises:
        a core copper pillar on a top surface of the metal pad;
        a dielectric layer wrapping around an outer surface of the core copper pillar;
        a metal layer wrapping around an outer surface of the dielectric layer; and
        a circuit board having a coaxial metal pad, the coaxial metal pad comprising:
            a core metal pad on a surface of the circuit board, wherein the core metal pad is bonded to the core copper pillar, wherein,
            in a cross-section view taken along a height direction of the coaxial copper pillar,
            a width of the core metal pad is smaller than a width of the core copper pillar; and
            a circular metal pad encircling the core metal pad.

4. The package substrate as claimed in claim 1, wherein the metal layer is a copper layer.

5. The package substrate as claimed in claim 1, further comprising:
    a circuit board having a coaxial metal pad, the coaxial metal pad comprising:
    a core metal pad on a surface of the circuit board, wherein the core metal pad is bonded to the core copper pillar; and
    a surrounding metal pad on the surface of the circuit board, the surrounding metal pad encircling the core metal pad while being spaced from the core metal pad, wherein the surrounding metal pad is bonded to the metal layer.

6. The package substrate as claimed in claim 5, wherein, in a cross-section view taken along a height direction of the coaxial copper pillar,
    a width of the core metal pad is smaller than a width of the core copper pillar, and
    a width of the surrounding metal pad is greater than a width of the metal layer.

7. The package substrate as claimed in claim 6, wherein the surrounding metal pad and the dielectric layer partially overlap in the height direction of the coaxial copper pillar.

8. The package substrate as claimed in claim 7, wherein the surrounding metal pad is electrically grounded, and the core metal pad is electrically connected to a signal line of the circuit board.

9. The package substrate as claimed in claim 1, further comprising:
    a plurality of copper pillars each on top of a corresponding top terminal pad among the plurality of top terminal pads,
    wherein, among the plurality of copper pillars, a copper pillar on top of the metal pad is the core copper pillar.

10. The package substrate as claimed in claim 9, wherein, in a cross-section view taken along a height direction of the coaxial copper pillar,
    a width of the core copper pillar is smaller than a width of another copper pillar among the plurality of copper pillars, and
    a width of the metal layer is smaller than the width of the core copper pillar.

11. The package substrate as claimed in claim 9, further comprising:
    a chip mounted on bottom surfaces of the plurality of bottom terminal pads.

12. The package substrate as claimed in claim 11, further comprising:
a circuit board having a coaxial metal pad, the coaxial metal pad comprising:
a core metal pad on a surface of the circuit board, wherein the core metal pad is bonded to the core copper pillar, and
a surrounding metal pad on the surface of the circuit board, the surrounding metal pad encircling the core metal pad while being spaced from the core metal pad, wherein the surrounding metal pad is bonded to the metal layer,
wherein
in a cross-section view taken along a height direction of the coaxial copper pillar,
a width of the core metal pad is smaller than a width of the core copper pillar, and
a width of the surrounding metal pad is greater than a width of the metal layer
the surrounding metal pad and the dielectric layer partially overlap in the height direction of the coaxial copper pillar,
the surrounding metal pad is electrically grounded, and
the core metal pad is electrically connected to a signal line of the circuit board.

13. A process for fabricating a package substrate having a metal pad and a coaxial copper pillar, the process comprising:
preparing a substrate comprising a bottom first redistribution circuitry and a bottom second redistribution circuitry on a bottom surface of the bottom first redistribution circuitry, wherein
the bottom first redistribution circuitry is embedded in a first dielectric layer, and the bottom first redistribution circuitry comprises:
a plurality of first conductive layers; and
a plurality of first conductive vias electrically connecting the plurality of first conductive layers to each other, wherein a top Most conductive layer among the plurality of first conductive layers comprises a plurality of top tell terminal pads one of which is the metal pad corresponding to the coaxial copper pillar, wherein
the bottom second redistribution circuitry is embedded in a second dielectric layer, and the bottom second redistribution circuitry comprises:
a plurality of second conductive layers; and
a plurality of second conductive vias electrically connecting the plurality of second conductive layers to each other, wherein a bottommost conductive layer among the plurality of second conductive layers comprises a plurality of bottom terminal pads, wherein
a thickness of each first conductive layer among the plurality of first conductive layers is greater than a thickness of each second conductive layer among the plurality of second conductive layers, and
a thickness of the first dielectric layer is greater than a thickness of the second dielectric layer;
forming a core copper pillar on a top surface of the metal pad;
forming a dielectric layer wrapping around an outer surface of the core copper pillar; and
forming a metal layer wrapping around an outer surface of the dielectric layer to obtain the coaxial copper pillar which includes the core copper pillar, the dielectric layer and the metal layer.

14. The process as claimed in claim 13, further comprising:
forming a passivation layer on the substrate, the passivation layer exposing a central area of each top terminal pad among the plurality of top terminal pads;
forming a seed layer on the plurality of top terminal pads and the passivation layer;
forming a first photoresist layer on the seed layer;
patterning the first photoresist layer to form a plurality of first grooves;
filling a metal, by plating, in the plurality of first grooves to form a plurality of copper pillars;
stripping the first photoresist layer;
stripping the seed layer between the plurality of copper pillars;
forming a second photoresist layer on the passivation layer and the plurality of copper pillars;
patterning the second photoresist layer to form a plurality of second grooves to expose selected copper pillars among the plurality of copper pillars;
filling a dielectric material into the plurality of second grooves to form the dielectric layer wrapping around an outer surface of each of the selected copper pillars;
removing the dielectric material on the plurality of copper pillars;
stripping the second photoresist layer;
forming a third photoresist layer;
patterning the third photoresist layer to form a plurality of third grooves to expose the selected copper pillars wrapped by the dielectric layer;
electroless plating a metal into the plurality of third groove to form the metal layer wrapping around an exposed outer surface of the dielectric layer;
stripping the third photoresist layer; and
removing the metal on top surfaces of each of the selected copper pillars and the dielectric layer.

15. The process as claimed in claim 14, further comprising:
mounting at least a chip on bottom surfaces of the plurality of bottom terminal pads;
underfilling a space between the chip and the substrate; and
singulating to form a plurality of chip package units.

16. The process as claimed in claim 14, wherein, in said electroless plating, the metal is copper.

* * * * *